United States Patent [19]

Jason

[11] Patent Number: 4,727,337

[45] Date of Patent: Feb. 23, 1988

[54] PROTECTION CIRCUIT FOR RF POWER AMPLIFIERS

[75] Inventor: Barry Jason, Bedford, Tex.

[73] Assignee: Motorola, Inc., Schaumburg, Ill.

[21] Appl. No.: 42,182

[22] Filed: Apr. 24, 1987

[51] Int. Cl.$^4$ .............................................. H02H 7/20
[52] U.S. Cl. ............................... 330/298; 330/207 P; 455/117
[58] Field of Search ................... 330/207 P, 279, 289, 330/298; 455/117, 127

[56] References Cited

U.S. PATENT DOCUMENTS

| | | | |
|---|---|---|---|
| 3,641,451 | 2/1972 | Hollingsworth et al. | 330/134 |
| 3,866,136 | 2/1975 | Augustin et al. | 330/207 |
| 4,313,210 | 1/1982 | Hume et al. | 455/117 |
| 4,547,746 | 10/1985 | Erickson et al. | 330/298 |
| 4,626,767 | 12/1986 | Clappier et al. | 455/117 X |

Primary Examiner—Eugene R. LaRoche
Assistant Examiner—Steven J. Mottola
Attorney, Agent, or Firm—Melvin A. Schechtman

[57] ABSTRACT

An improved power controller and protection circuit to regulate the RF output power of a radio transmitter and to protect its RF amplifier from overload damage. The controller features a floating input, voltage controlled current source with high common-mode rejection to provide feedback of the DC input current drawn by the RF power amplifier. The controller can use an arbitrary reference voltage, which allows its application universally with power amplifiers designed for different rated output powers and frequency ranges.

6 Claims, 4 Drawing Figures

PROTECTION CIRCUIT FOR RF POWER AMPLIFIERS

BACKGROUND OF THE INVENTION

1. Technical Field of the Invention

This invention applies to automatic control systems for regulating and protecting radio frequency (RF) power amplifiers in transmitters and transceivers. In particular, it applies to controllers that receive feedback from several operating parameters of a power amplifier, including its direct current (DC) input, to perform closed-loop regulation.

2. Description of the Prior Art

Many radio transmitters include automatic control systems to regulate RF output power, to prevent amplifier damage from causes such as antenna load mismatch, excessive supply voltage, and excessive operating temperature, and to minimize additional damage after failure of one or more power devices.

FIG. 1 shows a typical RF power amplifier, 101, and power controller, 141, for a mobile transceiver. The power amplifier takes signals from an exciter, 103, amplifies them, and delivers them to an antenna, 111, or other RF load. The amplifier comprises a low-level driver stage, 105, and a high-power final stage, 107. The power amplifier receives its DC power through a cable, 119, coupled to a remote battery, 117, with ground return 123. The cable may have substantial distributed impedance. The power controller, comprising amplifier 143, frequency compensation capacitor 172, and buffer 145, receives control inputs, 161, and feedback signals, 151, and produces an output, 147, that varies the gain of the low-level driver stage.

The controller regulates output power during normal conditions and protects the amplifier during abnormal conditions by using negative feedback to diminish the error between the greatest feedback signal and a reference input that has been selected according to the nominal operating levels of the feedback transducers. In this example, several signals feed back from the power amplifier, including forward and reflected power indications, 113 and 115, respectively, from RF detectors coupled to the sampling arms of a directional coupler, 109; device temperature, 133, from a thermistor, 131, that is thermally coupled to the final amplifier devices; a differential voltage, 127-128, proportional to the amplifier's DC input current, 121, through a current-sampling resistor, 125; a signal, 129, that indicates the drive to the final amplifier; and a signal, 149, that feeds back the control voltage, 147, supplied to the driver. These feedback signals represent a typical design choice; other practical controllers contemplated within the scope of this invention would use these or similar signals.

Under normal conditions, all feedback signals except forward power are small. The controller increases drive until the forward power feedback signal becomes approximately equal to the reference input. Under abnormal conditions, another feedback signal will increase and exceed the forward power signal. For example, the reflected power reading increases when the antenna load becomes mismatched or removed. Increased RF drive without a corresponding increase in forward power indicates load mismatch or malfunction of one or more final devices. Excessive control voltage for a given output power indicates a problem in the low-level driver stage. Low DC input current indicates load mismatch or faulty driver or final devices. High DC input current or final device temperature indicates that the controller should reduce forward power demands on the amplifier. When one or more of these conditions occur, the controller reduces drive to the power amplifier to keep the largest feedback signal approximately equal to the reference input.

A difficulty in the prior art has been to design a generic controller to work with any of the amplifiers in a product line of a manufacturer, which may span different power levels and frequency ranges. Constraints in design of the directional couplers generally require that the reference voltage applied to the control amplifier be chosen according to the voltage at rated power from the forward power sensor; other feedback signals are scaled and translated to this common mode voltage. In particular, the feedback signal for DC input current must be translated from the battery voltage to the reference voltage applied to the non-inverting input of the control amplifier.

One prior art translation method is to sample the voltage across a series dropping resistor in the positive supply to the RF power amplifier with a voltage controlled current source driving a resistor coupled between the inverting input of the control amplifier and ground. This resistor typically develops only 100-300 mV at full current to avoid wasting voltage available to the amplifier. This design generally has poor common mode rejection, and the impedance of a long power cable, which may be as long as 22 feet in a mobile transmitter application, can affect stability of the control loop.

SUMMARY OF THE INVENTION

It is an object of this invention to provide a generic control amplifier that can receive feedback from a variety of sensors and can control power amplifiers designed for different frequency ranges and output power levels. It is another object to sample the DC input current of an RF power amplifier for feedback control without causing control loop instability.

The invention is to control an RF power amplifier by developing a source current proportional to its DC input current; developing a sink current proportional to a current limit; developing a feedback voltage by applying the difference between the source and sink currents to a non-linear conductance that is coupled to a reference voltage and whose incremental conductance is highest when the voltage across it is zero and decreases as the magnitude of the voltage across the conductance increases; and using the feedback voltage to prevent the DC input current from exceeding the predetermined limit.

BRIEF DESCRIPTION OF THE DRAWINGS

The invention may be better understood by reference to the Drawings, in which.

DESCRIPTION OF THE PREFERRED EMBODIMENT

Figure 1:
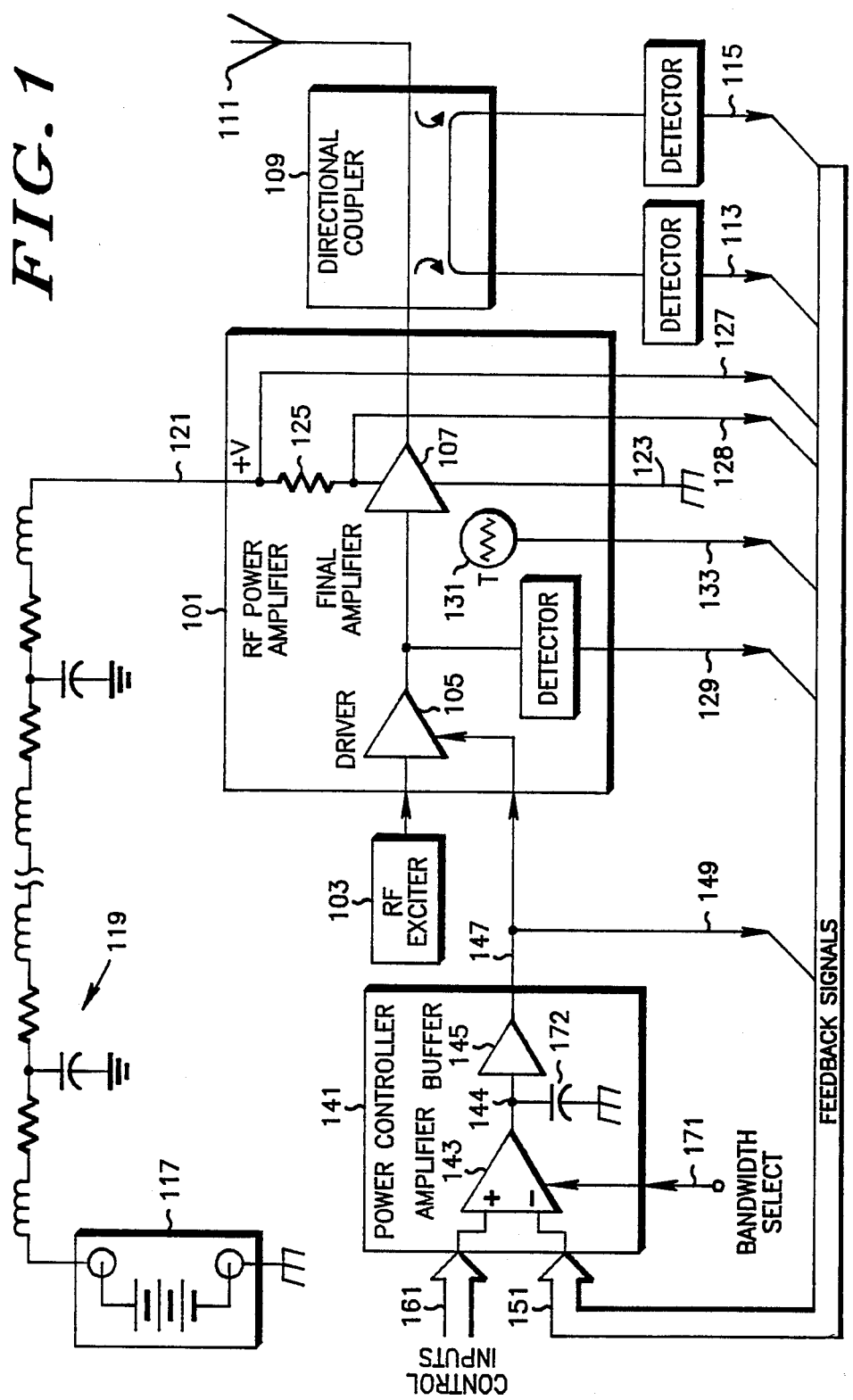
FIG. 1 is a block diagram of an RF power amplifier controlled and protected by a feedback system, which shows the environment in which the invention would find application.
Figure 2:
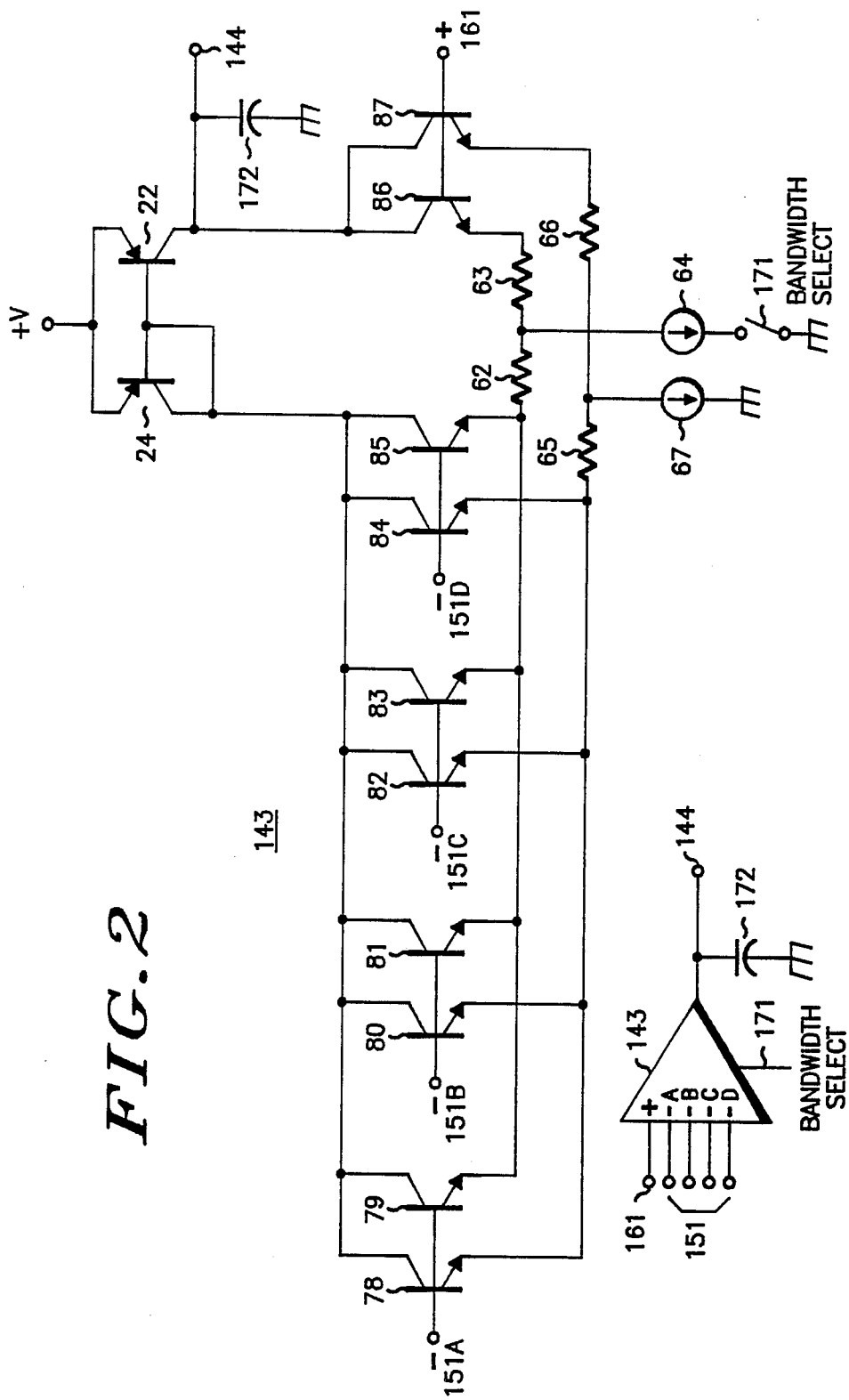
FIG. 2 shows the input stage of a control amplifier constructed according to the invention.

FIG. 2 shows the preferred embodiment of input stage for a control amplifier in a controller constructed according to the invention. The amplifier, 143, shown both in detail and by a graphic symbol, has a non-inverting input, 161, and four inverting inputs, 151a–d.

The amplifier input circuit comprises two groups of emitter-coupled transistors sharing a current-mirror load, 22–24, which produces an intermediate output at 144 compensated by capacitor 172. The first group comprises transistors 78, 80, 82, 84, and 87, with current source 67 and emitter degeneration resistors 65 and 66. The other group comprises transistors 79, 81, 83, 85, and 86 with switched current source 64 and degeneration resistors 62 and 63.

The reason for having two groups is to provide a selectable bandwidth feature, which can be used in a mobile transmitter application to prevent high frequency power supply ripple, often caused by an engine alternator, from phase modulating the RF output. At the beginning of a transmission, the RF output should quickly stabilize at rated power, which requires wide bandwidth in the control loop. However, if ripple on the DC supply produces RF power fluctuations, a wide bandwidth controller would sense the fluctuations and compensate by varying the control voltage to the low-level driver stage. Varying the control voltage could introduce phase modulation in the low-level RF output through the varactor capacitance of the driver devices. Reducing the controller bandwidth prevents the loop from responding to the fluctuations and avoids phase modulation by this mechanism.

The state of current source 64 affects the slew rate and bandwidth of the amplifier. The slew rate depends on the compensation capacitance and the bias current; the bandwidth depends on the compensation capacitance and the transconductance, which, in turn, depends on both the bias current and the degeneration resistance. Current source 67 and resistors 65 and 66 give low bias current and low transconductance; current source 64 and resistors 62 and 63 give high bias current and high transconductance. With current source 64 turned off, the amplifier operates in narrow bandwidth mode. With current source 64 turned on, both groups of differential transistors function; however, the high current/high transconductance group dominates and gives the amplifier wide bandwidth. External bandwidth control can be arranged to give wide bandwidth to reach rated power rapidly and to switch to narrow bandwidth after the output has settled.

The control amplifier is designed to select the parameter that provides the greatest amplitude feedback. The multiple inverting inputs, transistors pairs 78–79, 80–81, 82–83, and 84–85, perform these functions. When one feedback signal becomes larger than the others, its respective input overrides the others and functions as a conventional differential input. When another feedback signal become larger, it overrides the others and controls. If several signals have approximately the same magnitude, their input transistors share the total current on the inverting side of the amplifier, which, because of the high gain, approximately balances the current through the non-inverting side.

The preferred embodiment has a full complement of sensors, including forward power, 113, reflected power, 115, temperature, 133, drive voltage limit, 129, control voltage limit, 149, and current sensing, 127–128. In normal operation, with the transmitter feeding a matched load, supply voltage within normal limits, and all power and low-level devices functioning, the feedback signals for reflected power, temperature, drive voltage, control voltage, and DC input current are lower than the forward power reading, which will, therefore, control the amplifier. If the antenna becomes disconnected or the standing wave ratio (VSWR) of the load increases, reflected power will override the other signals If the power amplifier temperature rises, it will override the forward power signal, and the control amplifier will shut down the power amplifier as necessary to keep its temperature within design goals.

Figure 3:
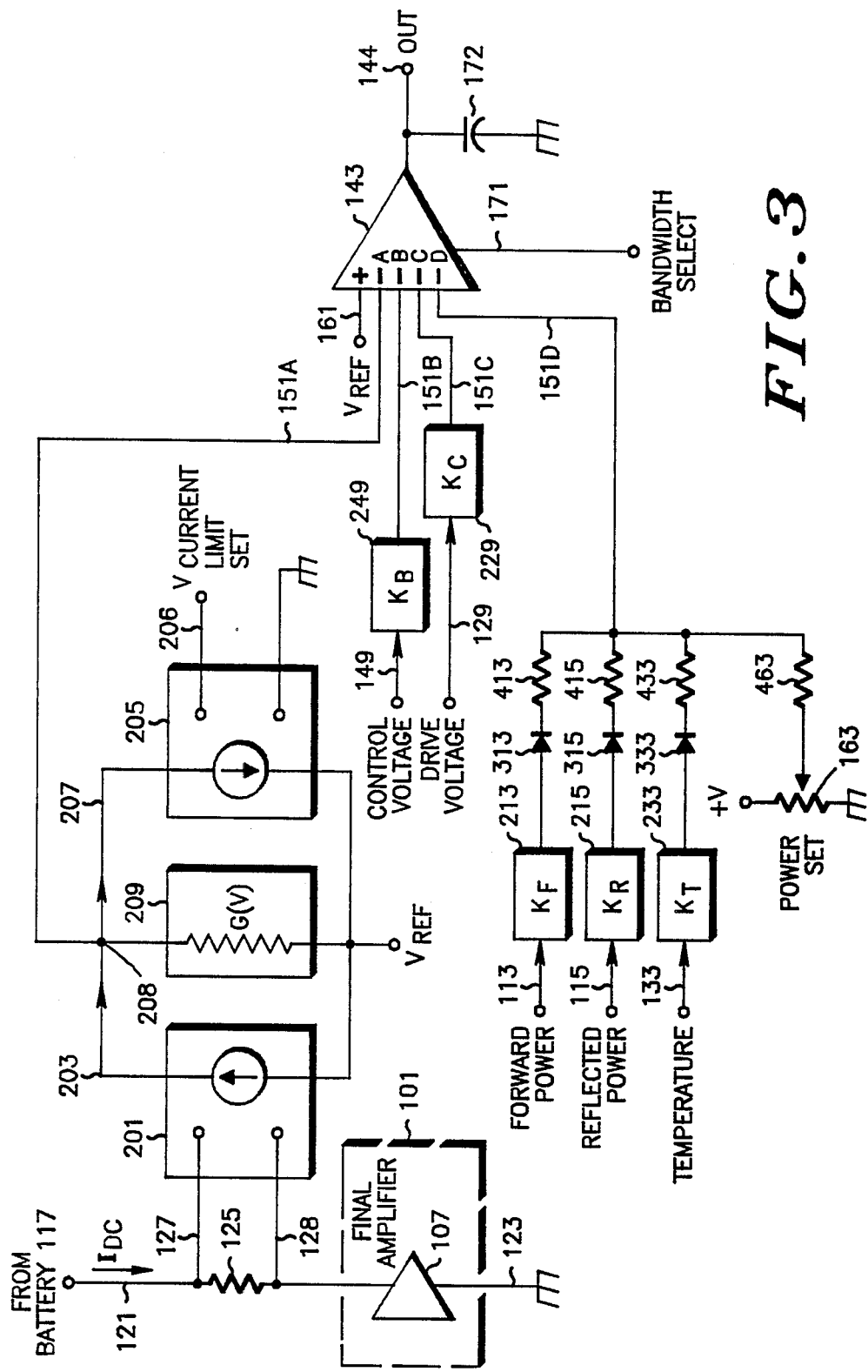
FIG. 3 shows how outputs from various sensors within the power amplifier may be coupled to provide feedback to the input of a control amplifier constructed according to the invention.

FIG. 3 shows how feedback signals may be coupled to the control amplifier of the preferred embodiment. Because this amplifier has only four distinct inputs, whereas there are six feedback signals, the signals have been grouped externally and combined with appropriate reference voltages to produce four signals.

At input 151d, the forward power, reflected power, and temperature signals have been combined with a forward power reference voltage. Coefficient $K_f$, 213, which may be a resistive divider on the output of the forward power RF detector, scales the forward power level. Similarly, coefficient $K_r$, 215, scales the reflected power reading. Coefficient $K_t$, 233, scales the output of the thermistor. Diodes 313, 315, and 333 isolate the signals from each other. The forward power signal rises until it balances power set level 163, which is negative with respect to $V_{ref}$.

Control voltage 149, scaled by coefficient $K_b$, 249, and RF drive voltage 129, scaled by coefficient $K_c$, 229, feed inputs 151b and 151c, respectively. If either of these signals overrides the greatest from the group at input 151d, the amplifier will again cut back output power to minimize the feedback error.

The invention is to measure DC input current accurately and to feed back a signal that can be used without affecting loop stability. Input 151a senses the DC input. Current 121 through the cable kit from battery 117 flows through sensing resistor 125 and develops a voltage between 127 and 128 that couples to a floating input, voltage-controlled current source, 201. Controlled current source 205 sinks a current from node 208 that establishes a current limit according to voltage 206. The DC input current may rise until the current from source 201, which is proportional to the DC input current, balances the current drawn from node 208. If the DC input exceeds the limit, current source 201 will source additional current into node 208, the voltage on input 151a will rise and override the other inverting inputs, and the control system will then cut back the control voltage to prevent the DC input from exceeding the limit.

The current sources have high output resistances, which makes the impedance at node 208 normally very high. With high impedance, which is desirable to provide high loop gain for rapid correction of over-current conditions, the node can be affected by stray capacitance. To stabilize the loop gain during current limiting, a non-linear conductance, 209, loads node 208 lightly when the DC input current differs from the limit and loads it more heavily once current limiting is in effect.

Figure 4:
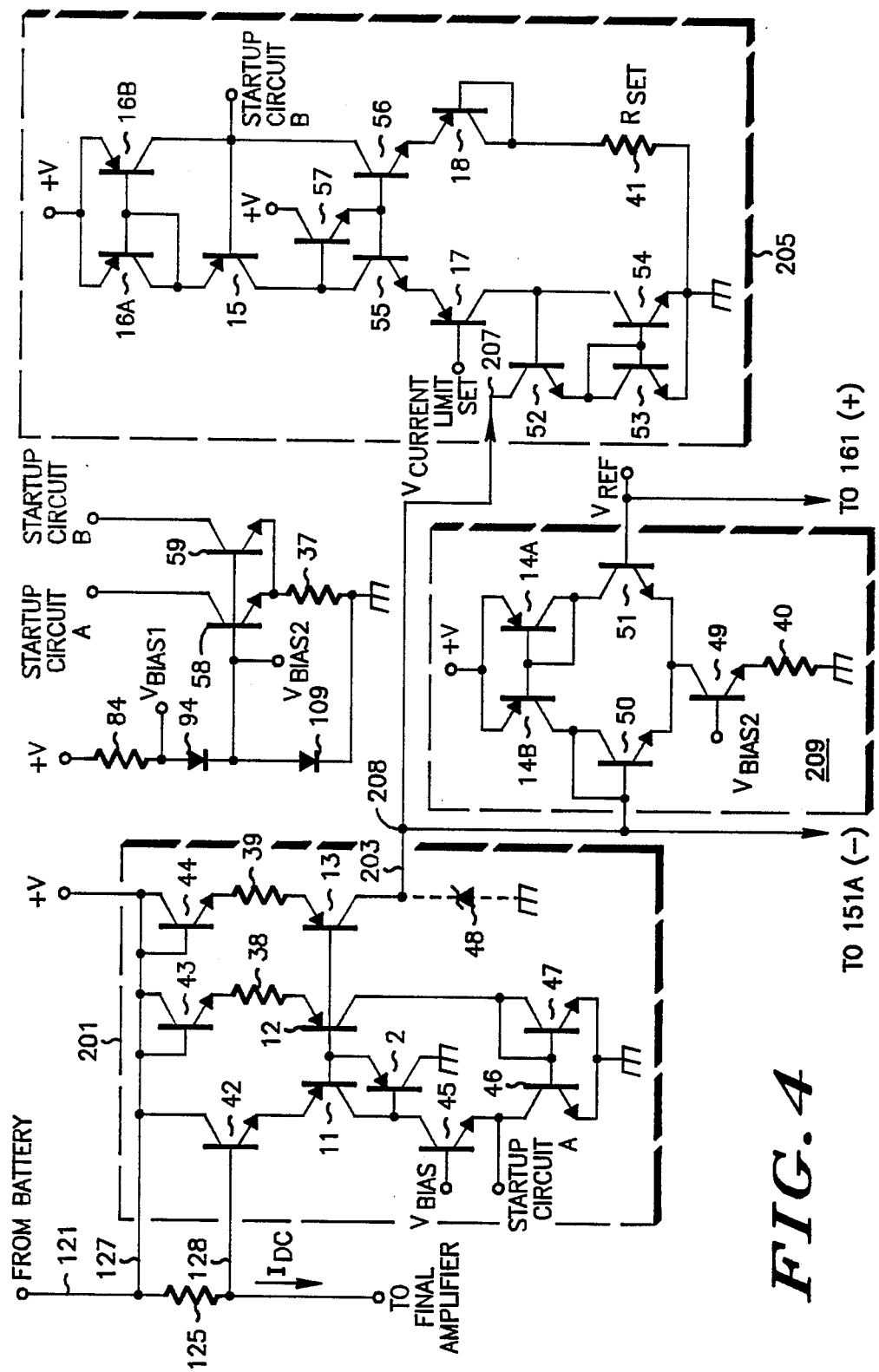
FIG. 4 shows a floating, voltage-controlled current source and a non-linear conductance load, both constructed according to the invention, which provide feedback of the DC input current of the power amplifier.

FIG. 4 shows details of the voltage-controlled current sources and the non-linear conductance. Block 201 is a schematic of the current source that samples the voltage across resistor 125 to source a corresponding output current, 203, into node 208. Since the voltage drop across the sensing resistor is kept within the range of 100-300 mV to avoid wasting voltage available to the power amplifier, offsets must be kept small to preserve accuracy. Transistors 11-12-2 and 46-47 are current mirrors coupled in a feedback loop, which causes identical currents to flow in matched transistors 42 and 43 and causes them to have identical $V_{be}$'s, independent of temperature. Startup circuit A, comprising transistor 58 and resistor 37 biased from string 84-94-109, draws a very small current through the coupled current mirrors, which prevents them from remaining in a stable state of zero current. With identical $V_{be}$'s and currents for transistors 42 and 43, the drop across resistor 38 equals the voltage across resistor 125. Transistor 13, coupled to the base of transistor 12, causes the same current to flow through resistor 39 and diode-connected transistor 44 as through resistor 38 and diode-connected transistor 43. Zener diode 48 may be connected across node 208 to prevent the node voltage from rising high enough to latch-up the control amplifier input.

To prevent instability of the control loop, the current source must have excellent common-mode rejection. In particular, transistor 13 must have high output impedance to prevent common mode voltage variations at resistor 125 from affecting output current 203, which provides the feedback signal. Once the voltage drop across resistor 39 reaches 4 to 5 times kT/q, or about 100 mV at room temperature, resistor 39 raises the output impedance of transistor 13 to approximately its beta times its intrinsic output resistance, which gives extremely high common mode rejection.

Current source 205 develops the sink current 207 at node 208. Transistors 16a-16b-15 and 55-56-57 are coupled current mirrors that develop identical currents through devices 17 and 18. As before, to prevent the mirror loop from remaining in a stable state of zero current, startup circuit B, comprising transistor 59 and resistor 37, draws a startup current through the mirror. It is desirable for this current to be very small, which requires a large value for resistor 37. Sharing resistor 37 between startup circuits A and B doubles the effective resistance seen by each circuit and saves considerable area in a monolithic implementation. With the loop forcing equal currents through matched devices 17 and 18, the voltage across $R_{set}$ 41 will equal the voltage applied between the base of 17 and ground. Thus, the magnitude of current through devices 17 and 18 equals that voltage divided by the resistance of resistor 41. Current mirror 53-54-52 replicates the current through device 17 as sink current 207 from node 208. Device 52 raises the output impedance of the basic current mirror to provide high impedance at node 208.

Block 209 is the non-linear conductance coupled between node 208 and the reference voltage applied to the non-inverting input, 161, of the control amplifier. The circuit is essentially an emitter-coupled pair, 50-51, biased from current source 49-40 and loaded by current mirror 14a-14b. When the voltage at the base of 50 equals the voltage at the base of 51, the emitter-coupled pair is balanced, and the constant current divides equally. The input current drawn from node 208 then is only the slight base current needed to support the emitter current of device 50. As the voltage at 208 rises, device 50 turns on harder, device 51 begins to cut off, and the current mirror 14a-14b decreases the mirror current supplied to the collector of 50. The constant current source continues to sink the same current, so the external system coupled to node 208 must supply additional current to the collector of device 50 through the external connection from base to collector. Once the voltage at 208 rises to more than several kT/q above the voltage at the base of 51, device 51 will be completely cut-off, and the external circuit will supply the maximum current. At that point, the incremental loading from the non-linear conductance reaches minimum. As the voltage at node 208 falls below the reference voltage applied to device 51, device 50 turns off, but device 51 turns on harder and pulls more current through mirror 14a-14b. The additional mirror current flows out the base connection at device 50 into the external circuit coupled to node 208. Once the voltage at 208 drops below $V_{ref}$ by more than several kT/q, no additional current flows outward. In effect, when the voltage on node 208 is at balance with $V_{ref}$, the circuit within block 209 loads node 208 with an incremental conductance equal to the reciprocal of the sum of the emitter resistances of devices 50 and 51. As node 208 moves away from the balance point, the incremental conductance approaches zero, which provides the highest gain and best slewing current for the control system.

Although the invention has been disclosed in connection with the particular embodiment of control amplifier and current sources described above, it is understood that the novelty lies in a control amplifier design that allows feedback signals to be combined so that the amplifier responds to the overriding feedback signal at any instant and in a current source that has high common-mode rejection and is loaded by a non-linear conductance to develop a feedback voltage proportional to the DC input current of the power amplifier that can be used without affecting the stability of the control loop. The scope of the invention as claimed includes modifications and additional applications that will be apparent to those skilled in the art.

I claim:

1. In a feedback system for regulating the output power of a radio frequency (RF) power amplifier and for protecting the RF power amplifier from damage during operation, the feedback system comprising a control amplifier that minimizes the difference between a reference voltage and a feedback voltage related to a selected operating parameter of the RF power amplifier by controlling the gain of the RF power amplifier, an improved method of limiting a DC input current of the RF power amplifier comprising the steps of:

developing a source current proportional to the DC input current of the power amplifier;

developing a sink current proportional to a predetermined current limit;

developing a feedback voltage related to the difference between the source and sink currents; and controlling the gain of the RF power amplifier to cause the feedback voltage to be substantially equal to or less than the reference voltage, whereby the DC input current of the RF power amplifier will be substantially equal to or less than the current limit.

2. The improved method of limiting the DC input current of an RF power amplifier according to claim 1 in which the step of developing the feedback voltage comprises applying the source and sink currents to a non-linear load conductance coupled to the reference voltage, the non-linear conductance having maximum incremental conductance when the voltage across it is zero and decreased incremental conductance when the magnitude of the voltage across it is greater than zero.

3. In a feedback system for regulating the output power of a radio frequency (RF) power amplifier and for protecting the RF power amplifier from damage during operation, the feedback system comprising a control amplifier that minimizes the difference between a reference voltage and a feedback voltage related to a selected operating parameter of the RF power amplifier by controlling the gain of the RF power amplifier, an improved apparatus for limiting a DC input current of the RF power amplifier comprising:

means for developing a source current proportional to the DC input current of the power amplifier;

means for developing a sink current proportional to a predetermined current limit;

means for developing a feedback voltage related to the difference between the source and sink currents; and means for controlling the gain of the RF power amplifier to cause the feedback voltage to be substantially equal to or less than the reference voltage, whereby the DC input current of the RF power amplifier will be substantially equal to or less than the current limit.

4. The improved apparatus of claim 3 for limiting the DC input current of an RF power amplifier in which the means for developing a source current proportional to the DC input current of the power amplifier and the means for developing a sink current proportional to the predetermined current limit comprise voltage controlled current sources that have high common mode rejection.

5. The improved apparatus of claim 3 for limiting the DC input current of an RF power amplifier in which the means for developing a feedback voltage comprises a non-linear conductance coupled between the source and sink currents and the reference voltage, the non-linear conductance having maximum incremental conductance when the voltage across it is zero and decreased incremental conductance when the magnitude of the voltage across it is greater than zero.

6. The improved apparatus of claim 5 for limiting the DC input current of the RF power amplifier in which the non-linear conductance comprises:

a constant current source;

a current mirror having input and mirror terminals, which mirrors the current at its input terminal to its mirror terminal; and an emitter-coupled pair of bipolar junction transistors having first and second base, collector, and emitter terminals, respectively, the first and second emitter terminals coupled to each other and to the constant current source, the first collector terminal coupled to the input terminal of the current mirror, the second collector terminal coupled to the mirror terminal of the current mirror, the first base terminal coupled to the reference voltage, and the second base terminal coupled to the output terminal of the current mirror and to the source and sink currents.

* * * * *